(12) United States Patent
Aitken et al.

(10) Patent No.: US 7,715,248 B2
(45) Date of Patent: May 11, 2010

(54) PHASE-CHANGE TAN RESISTOR BASED TRIPLE-STATE/MULTI-STATE READ ONLY MEMORY

(75) Inventors: John M. Aitken, South Burlington, VT (US); Fen Chen, Williston, VT (US); Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 12/109,081

(22) Filed: Apr. 24, 2008

(65) Prior Publication Data

US 2008/0232159 A1 Sep. 25, 2008

Related U.S. Application Data

(62) Division of application No. 11/161,332, filed on Jul. 29, 2005, now Pat. No. 7,381,981.

(51) Int. Cl.
G11C 7/00 (2006.01)
G11C 7/22 (2006.01)

(52) U.S. Cl. ............................ 365/189.15; 365/185.03; 365/189.011; 257/2; 257/246; 257/E29.234; 257/E29.235; 257/E29.24; 257/E29.236; 257/E29.238; 257/E29.239

(58) Field of Classification Search ............ 365/185.03, 365/189.011, 189.15; 257/2, 246, E29.234, 257/E29.235, E29.24, E29.236, E29.238, 257/E29.239
See application file for complete search history.

(56) References Cited

U.S. PATENT DOCUMENTS

| | | | |
|---|---|---|---|
| 3,594,737 A | 7/1971 | Montrouge et al. | |
| 5,323,138 A * | 6/1994 | Oki et al. ................... | 338/307 |
| 6,151,241 A | 11/2000 | Hayashi et al. | |
| 6,696,355 B2 | 2/2004 | Dennison | |
| 6,825,092 B2 | 11/2004 | Zurcher et al. | |
| 6,890,810 B2 | 5/2005 | Amadon et al. | |
| 7,289,350 B2 * | 10/2007 | Roehr ........................ | 365/148 |
| 7,329,585 B2 * | 2/2008 | Keum et al. ................. | 438/381 |
| 2001/0019160 A1 | 9/2001 | Kravtchenko et al. | |
| 2003/0003691 A1 | 1/2003 | Dennison et al. | |
| 2004/0042261 A1 | 3/2004 | Tuttle | |

(Continued)

FOREIGN PATENT DOCUMENTS

JP 7-7183103 A 7/1995

OTHER PUBLICATIONS

Abbas, et al, "Electrically Alterable Resistors", IBM TDB vol. 24, No. 7A, Dec. 1981, pp. 3460-3461.

*Primary Examiner*—VanThu Nguyen
(74) *Attorney, Agent, or Firm*—Scully, Scott, Murphy & Presser, P.C.; David A. Cain, Esq.

(57) ABSTRACT

The present invention relates to a nonvolatile memory such as, for example a ROM or an EPROM, in which the information density of the memory is increased relative to a conventional nonvolatile memory that includes two logic state devices. Specifically, the nonvolatile memory of the present invention includes a SiN/TaN/SiN thin film resistor embedded within a material having a thermal conductivity of about 1 W/m-K or less; and a non-linear Si-containing device coupled to the resistor. Read and write circuits and operations are also provided in the present application.

20 Claims, 5 Drawing Sheets

U.S. PATENT DOCUMENTS

| | | |
|---|---|---|
| 2004/0069982 A1 | 4/2004 | Lowrey et al. |
| 2004/0114413 A1 | 6/2004 | Parkinson et al. |
| 2004/0124485 A1 | 7/2004 | Yates et al. |
| 2005/0093091 A1 | 5/2005 | Badami et al. |
| 2005/0104102 A1 | 5/2005 | Fukuzumi |
| 2006/0002173 A1 | 1/2006 | Parkinson et al. |
| 2006/0145291 A1 | 7/2006 | Badami et al. |
| 2006/0163685 A1 | 7/2006 | Chen et al. |
| 2006/0181388 A1 | 8/2006 | Chinthakindi et al. |
| 2006/0203541 A1 | 9/2006 | Toda |
| 2007/0002101 A1 | 1/2007 | Bell et al. |
| 2007/0023743 A1 | 2/2007 | Aitken |

* cited by examiner

PHASE-CHANGE TAN RESISTOR BASED TRIPLE-STATE/MULTI-STATE READ ONLY MEMORY

RELATED APPLICATIONS

This application is a divisional of U.S. patent application Ser. No. 11/161,332, filed Jul. 29, 2005.

FIELD OF THE INVENTION

The present invention relates to a semiconductor integrated circuit (IC), and more particularly, to an IC memory cell and chip including at least a thin film phase-change resistor coupled to a non-linear Si-containing semiconductor device. In accordance with the present invention, the impedance of the phase-change resistor may be modulated by varying an applied voltage, which causes a Joule heating induced phase change in one of the resistor elements. The variation in impedance may be correlated to a plurality of device states or memory values. An IC memory chip contains thousands, even millions of memory cells, but all of them may share one write circuit and one read circuit.

BACKGROUND OF THE INVENTION

A nonvolatile memory is a solid-state device that does not need to have its memory contents periodically refreshed. Nonvolatile type memory devices are used in various applications in which logic instructions must be stored for later recall, including, for example, computers, calculators, personal digital assistances (PDA), mobile cell phones, and appliances as well as automotive, aerospace, medical, military and industrial equipment.

Such memory differs from volatile memory that does not maintain its contents without electrical power, which is made up of dynamic random access memory (DRAM) or static random access memory (SRAM) chips. In volatile memory, the data stored is lost when the power of the device is tuned off. Applications for volatile memory include any in which logic instructions must be stored and changed as needed by a user.

Various types of nonvolatile memory are known including all forms of read-only memory (ROM) such as programmable read-only memory (PROM), electrical programmable read-only memory (EPROM), electrically erasable read-only memory (EPROM), all types of flash random access memory (RAM), and hard-wired logics such as application-specific IC (ASIC), programmable logic devices (PLD), programmable array logic (PAL) ICs, programmable logic array (PLA), mask-programmable gate array chips (MPGA) and filed-programmable gate arrays (FPGA).

In earlier semiconductor devices, ROM was used in storing data. A ROM IC is a nonvolatile memory that is programmed directly during the IC manufacturing process. ROM is a type of memory that normally can only be read, as opposed to RAM which can be both read and written. The reasons that ROM is used are permanence and security of information storage for certain applications. ROM has been replaced with EPROM (electrical programmable read-only memory). EPROM is a memory device in which the data can be electrically programmed in the field without having to remove it from a circuit broad. As such, EPROM provides a more convenient memory for storing data than a conventional ROM.

Conventional nonvolatile memory such as ROM or EPROM usually is a two logic state device, which limits the information density of the memory. As such, a simple nonvolatile memory is needed which can increase the information density of the memory beyond that of a conventional nonvolatile memory device but still with simple integration scheme and low manufacturing cost.

SUMMARY OF THE INVENTION

The present invention provides a nonvolatile memory such as, for example, a ROM or EPROM, in which the information density of the memory is increased relative to a conventional nonvolatile memory that includes only two logic state devices. Specifically, the present invention provides a simple two-terminal element as a base for a ROM. In accordance with the present invention, the device element of the present invention is built at the back-end-of-the-line (BEOL) instead of the front-end-of-the-line (FEOL), which could significantly minimize the increasing FEOL complexity and increase on-chip memory density by stacking them together within different BEOL levels without consuming extra die surface area. The device element of the present invention also offers multilevel storage and low-voltage operation, which offer another advantage to increase density and reduce power. By adopting the inventive device element, a fast, simple, high-density, one-time programmable nonvolatile memory is provided.

The device element referred to above is a thin film resistor that comprises a SiN/TaN/SiN stack that is placed at a distance from about 5.00 μm or greater from the surface of a semiconductor substrate, e.g., Si. The resistor of the present invention is embedded within a low thermal conductivity (on the order of about 1.00 W/m-K or less) interlevel dielectric (ILD) material. Examples of ILDs having a low thermal conductivity include various spin-on organic polymers and chemical vapor deposited (CVD) glasses such as carbon doped oxide and $SiO_2$. The device element of the present invention is fabricated into simple two-terminal arrays vertically (i.e., vertical to the semiconductor substrate as a via type) or parallel (i.e., parallel to the semiconductor substrate).

In accordance with the present invention, the impedance state of the device element of the present invention, i.e., the thin film SiN/TaN/SiN resistor, can be modulated by input electrical power due to Joule heating induced TaN phase change. Positive or negative voltage/current pulses can change the resistance of TaN in times shorter than about 100 ns. In one example, the existence of at least four distinct resistance levels demonstrates that two bits of information can be stored in the inventive device.

The physics of such resistance change is attributed to phase transition inside TaN. A relevant property of such a phase change is the ability of TaN to keep information for very long times. By increasing input electrical power even more (over a threshold), a drastic resistance drop can be observed. The resistance drop described above is attributed to a second amorphous phase transition inside TaN. Therefore, the TaN based element (i.e., thin film resistor stack) can be optimally coupled with a non-linear Si-containing device (such as a diode which can be part of a field effect transistor) to form an electrically alterable one-time EPROM array with short access time, low-cost, high-density, and low power operation.

As stated above, the present invention provides an IC memory cell that is based on a thin film (SiN/TaN/SiN) resistor coupled to a non-linear Si-containing device. As also stated above, the impedance of this resistor may be modulated by varying an applied voltage which causes a Joule heating induced phase change in the TaN element. The variation of the impedance may be correlated to a plurality of device states or memory values. In one embodiment, a tri-state nonvolatile memory is provided. In addition to a tri-state memory, the present invention also contemplates a multi-state memory.

The nonvolatile memory may be EPROM, ROM or any other type of nonvolatile memory. Other types of nonvolatile memory that can include the inventive thin film resistor include, but are not limited to: PROM, ASIC, PLD, PAL ICs, PLA, MPGA and FPGA.

Specifically, and in general terms, the present invention provides a nonvolatile integrated circuit (IC) memory cell that comprises:

a SiN/TaN/SiN film resistor embedded within a material having a thermal conductivity of about 1.00 W/m-K or less; and a non-linear Si-containing device coupled to the resistor.

More specifically, the present invention provides a memory cell for an IC that includes:

a first switching field effect transistor, a second switching field effect transistor and a SiN/TaN/SiN film resistor, wherein (a) one terminal end (e.g., source) of the first switching field effect transistor and one terminal end (e.g., source) of the second switching field effect transistor are connected in parallel and both are coupled to one terminal end of the SiN/TaN/SiN film resistor, (b) another terminal end (drain) of the first switching field effect transistor is coupled to a first terminal of the memory cell for voltage measurements of read or write operations, and (c) another terminal end (drain) of the second switching field effect transistor is coupled to a second terminal end of the memory cell for sink current in the read or write operation, said first and second switching field effect transistors including gates that are connected in parallel and are coupled to a terminal of the memory cell for address selection and another terminal end of the SiN/TaN/SiN film resistor is grounded.

The present invention also provides read and write circuits as well as a circuit for voltage control of the current source that can be used with such a memory chip.

The read circuit of the present invention includes:

first and second voltage comparators in which the positive inputs are connected in parallel to one terminal end (e.g., drain) of a third switching field effect transistor;

a current source coupled to one terminal end (e.g., drain) of a fourth switching field effect transistor, wherein the other terminal end (e.g., source) of said fourth switching field effect transistor is coupled to said second terminal end of the memory cell, wherein said third and fourth switching field effect transistors including gates that are connected to each other in parallel and coupled to a digital signal of a read operation, said first voltage comparator having its negative input coupled to a first reference voltage and said second voltage comparator having its negative input coupled a second reference voltage; and a decoder having two inputs coupled to outputs of the first and second voltage comparators.

With respect to the voltage control current source circuit, that circuit includes:

a tenth switching field effect transistor having a gate and one terminal end (e.g., drain) connected in parallel to a current source and one terminal end (e.g., drain) of an eleventh switching field effect transistor, wherein another terminal end (source) of the tenth switching field effect transistor is coupled to a terminal of a voltage control current source unit for positive power supply, and another terminal end (e.g., drain) of the eleventh switching field effect transistor is coupled to one terminal end (e.g., drain) of a twelfth switching field effect transistor and a gate of a thirteenth switching field effect transistor, said eleventh switching field effect transistor having a gate that is coupled to an input of an inverter and a terminal of a voltage control current source unit for ON/OFF control, said twelfth switching field effect transistor having a gate that is coupled to the output of said inverter and another terminal end (e.g., source) that is coupled to the terminal of the voltage control current source unit for positive power supply, and said thirteenth switching field effect transistor having a terminal end (e.g., drain) that is coupled to the terminal of the voltage control current source unit for output current and another terminal end (source) that is coupled to the terminal of the voltage control current source unit for positive power supply.

With respect to the write circuit, that circuit comprises:

fifth and sixth switching field effect transistors having terminal ends (e.g., sources) in parallel arrangement coupled to a positive input terminal of a third voltage comparator, the negative input of the third voltage comparator is coupled to one terminal end (e.g., source) of a seventh switching field effect transistor, wherein output of said the third voltage comparator is coupled to one input of a two input NAND circuit, another terminal end (e.g., source) of the fifth switching field effect transistor is coupled to a first threshold voltage, and a gate of the fifth switching field effect transistor is coupled to a digital signal for write "one" operation, another terminal end (e.g., source) of said sixth switching field effect transistor is coupled to a second threshold voltage and a gate of the sixth switching field effect transistor is coupled to a digital signal for write "two" operation, another terminal end (e.g., drain) of the seventh switching field effect transistor is coupled to a terminal a of the memory cell described above and a gate of the seventh switching field effect transistor and a gate of an eighth switching field effect transistor are connected in parallel and coupled to the digital signal of write operation, wherein another terminal end (e.g., drain) of the eighth switching field effect transistor and one terminal (e.g., drain) of a ninth discharge switching field effect transistor are connected in parallel and coupled to a terminal b of the voltage control current source unit, said ninth discharge field effect transistor having terminal ends that are coupled to terminal ends of a capacitor, and another input of said two input NAND is coupled to a digital signal of write "zero"; the output of said NAND is coupled to the terminal c of the voltage control current source unit.

Figure 4:
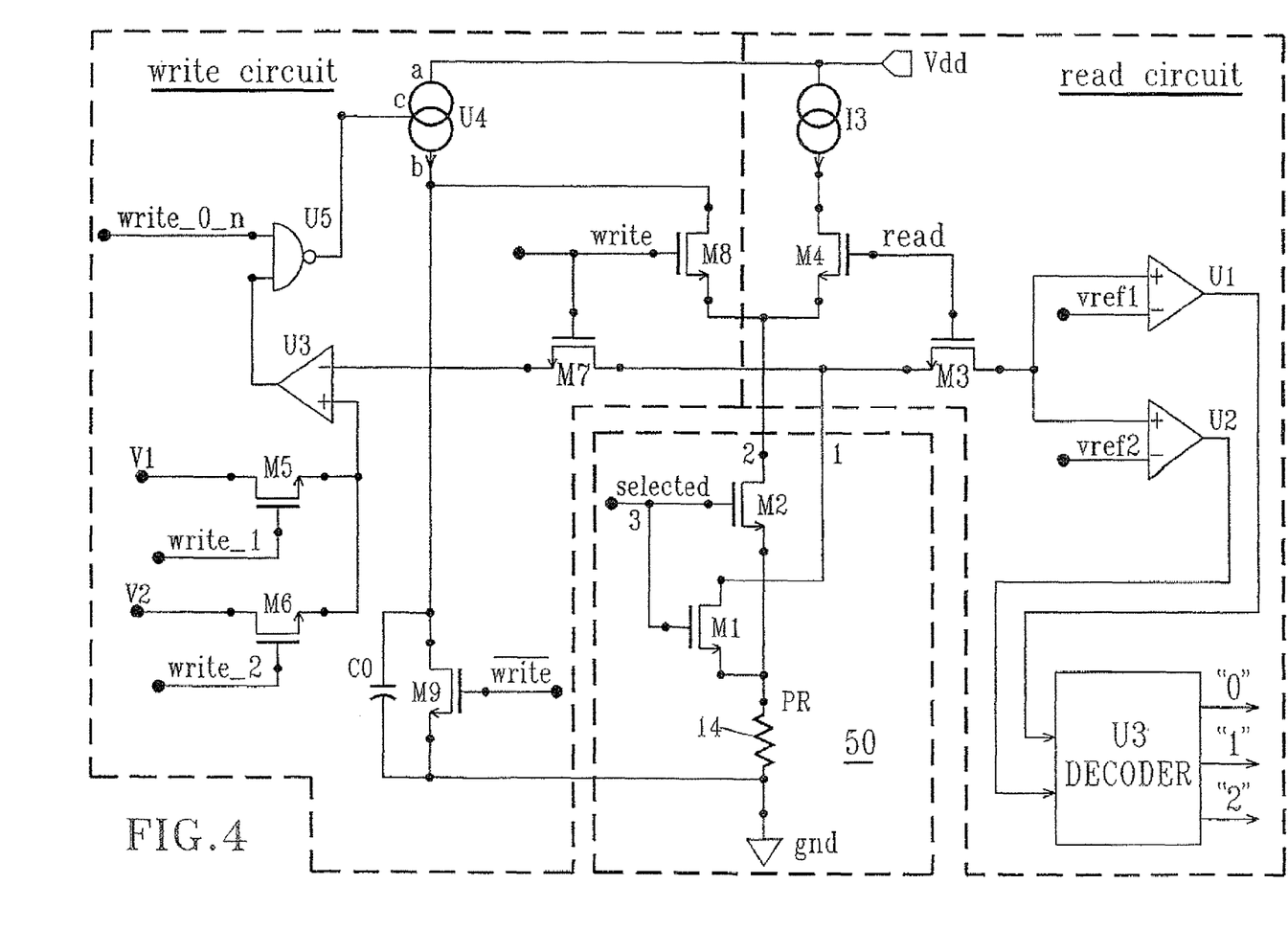
FIG. 4 is a circuit diagram depicting the nonvolatile IC memory chip of the present invention.
Figure 5:
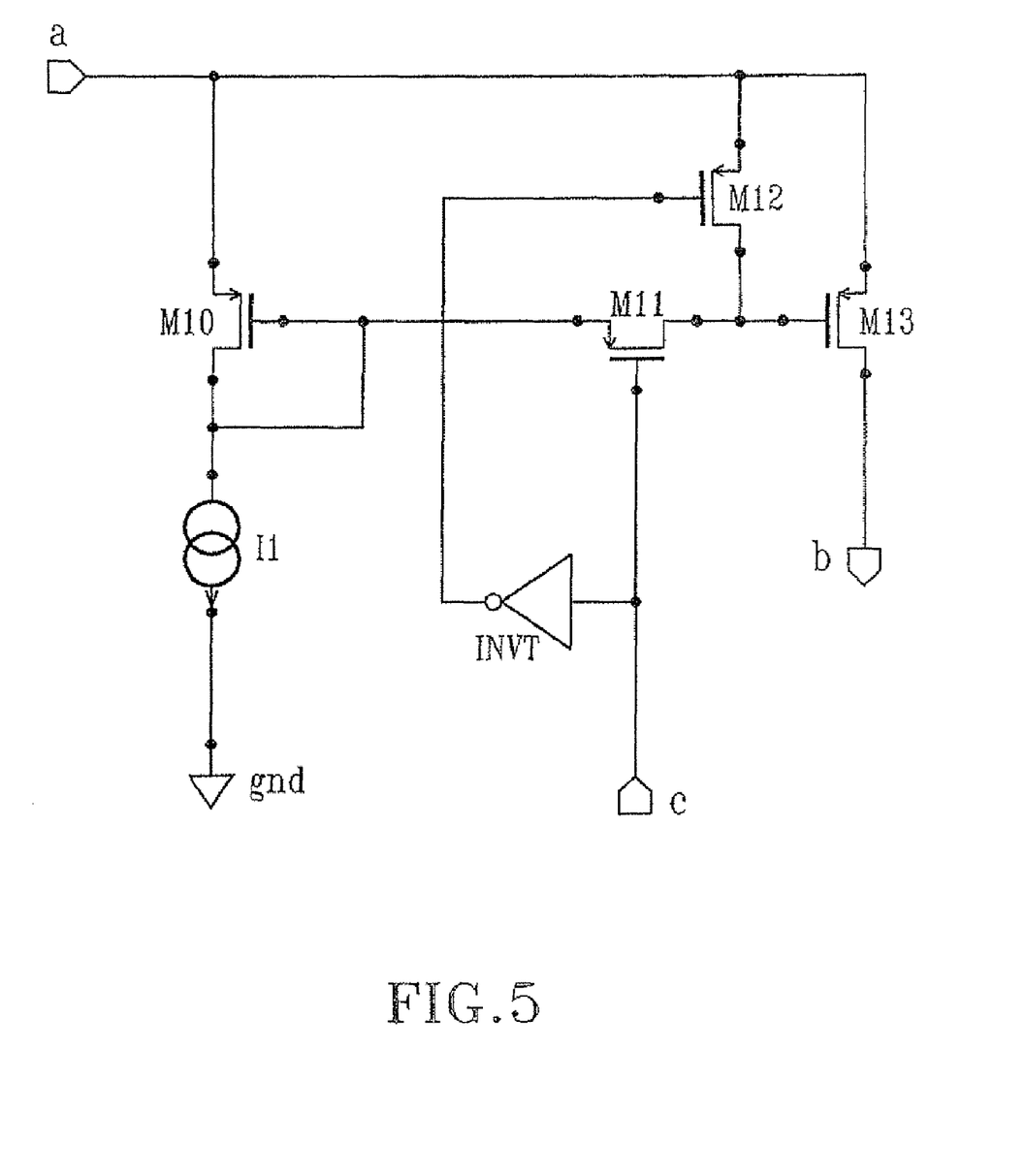
FIG. 5 is a circuit diagram depicting a voltage control current source unit depicted in FIG. 4.

It is noted that the description of the first, second, . . . thirteenth switching FETs as well as the other circuit elements are consistent with the memory cell layouts shown in FIGS. 4 and 5.

BRIEF DESCRIPTION OF THE DRAWINGS

FIGS. 1A-1B are pictorial representations of the basic device element that is used in the present invention formed into a simple two-terminal array; FIG. 1A is vertical to the semiconductor substrate and FIG. 1B is parallel to the semiconductor substrate.

DETAILED DESCRIPTION OF THE INVENTION

The present invention, which provides a three or more logic state nonvolatile IC memory cell including a phase-change TaN resistor, will now be described in greater detail by referring to the following discussion as well as drawings that accompany the present application.

As stated above, the present invention provides a two-terminal element as a base for one-time electrically programmable read-only memory (OEPROM's). The device element is built at the BEOL (i.e., during interconnect formation within at least one of the interlevel dielectrics of the interconnect structure) instead of the FEOL, which could significantly minimize the increasing FEOL complexity and increase on-chip memory density by stacking them together within different BEOL levels without increasing die surface area. This simple device also offers multilevel storage and low-voltage operation, which offers another advantage to increase density and reduce power. By adopting the inventive device, a fast, simple, high density, one-time electrically erasable triple state or multi-state ROM (read only memory) could be developed. In contrast, the conventional ROM is a two logic state device which limits the information density of the memory.

The device element of the present invention comprises a SiN/TaN/SiN stacked thin film resistor that is typically placed at a distance of about 5.00 μm or greater from a surface of a semiconductor substrate. The semiconductor substrate may include any semiconductor material including, for example, Si, SiGe, SiGeC, GaAs, Inks, InP, silicon-on-insulator (SOI), silicon germanium-on-insulators, or other like semiconductor materials. Typically, the semiconductor substrate used is a Si-containing substrate such as Si.

The SiN/TaN/SiN resistor of the present invention has an overall thickness of about 50 to about 1000 nm, with an overall thickness from about 100 to about 200 nm being more typical. Included within this overall thickness is the thickness of the TaN layer. Typically, the TaN layer has a thickness from about 10 to about 100 nm. The SiN layers located above and below the TaN layer can have the same or different thickness with a thickness for each of the SiN layers being from about 20 to about 400 nm.

The SiN/TaN/SiN resistor employed in the present invention can be made using the technique described, for example, in U.S. Ser. No. 11/161,332, filed Jul. 29, 2005, now U.S. Publication No. 2007/0023743 A1, the entire contents of which are incorporated herein by reference. Specifically, the SiN/TaN/SiN resistor is a precision resistor that is made by deposition of each of the layers of the resistor and then trimming the resistor by steps that include measuring a first resistance of the SiN/TaN/SiN resistor; comparing the first resistance to a targeted resistance; if the first resistance and the targeted resistance are not sufficiently close together, determining first trimming parameters for a first electrical power needed to permanently change the resistance of the resistor from the first resistance value to a second resistance value, the second resistance value is different from the first and is closer to the targeted value; and applying the first electrical power across the resistor according to the first trimming parameters.

It is observed that an as-deposited TaN film includes a mixture of amorphous and fine crystalline islands. Initial excessive field/heating of TaN is believed to cause rupture of the amorphous part and growth of conductive islands in the material. As a result, the resistance of TaN increases due to enhanced scattering. However, after further critical field/heating of TaN (i.e., field/heating that exceeds some critical temperature point), a more conductive or percolation path is believed to be formed due to the fusing of islands. As a result, the resistance of TaN decreases. This paragraph describes the basic concept of phase change that occurs to the TaN containing resistor during Joule heating. The Joule heating of the TaN containing resistor of the present invention is caused by applying a voltage to the resistor.

In accordance with the present invention, the TaN containing resistor is embedded in a low thermal conductivity ILD material. By "low thermal conductivity" it is meant a dielectric material having a thermal conductivity of about 1 W/m-K or less. Specifically, the ILD material employed in the present invention has a thermal conductivity from about 0.1 to about 0.5 W/m-k. Illustrative examples of such low thermal conductivity ILD materials that can be used in the present invention include, but are not limited to: various spin-on organic polymers such as hydrogen silsesquioxane, methyl silsesquioxane, sol-gel porous silica, various CVD glasses such as carbon doped oxide that includes atoms of Si, C, H and O (SiCOH), tetramethylsilane, trimethylsilane, methylsilane, and mixtures of tetramethylsilane and silane, or various $SiO_2$. The ILD may also include multilayers of such low thermal conductivity ILD materials.

The SiN/TaN/SiN resistor is embedded within the low thermal conductivity ILD material using techniques well known in the art, including, for example, deposition of the ILD material, providing an opening in the as deposited ILD by lithography and etching and forming the SiN/TaN/SiN within the opening. The deposition of the resistor layers may include the same or different deposition process including, but not limited to: chemical vapor deposition, plasma enhanced chemical vapor deposition, atomic layer deposition, evaporation, chemical solution deposition, metalorgano deposition and other like deposition processes.

Figure 1A:
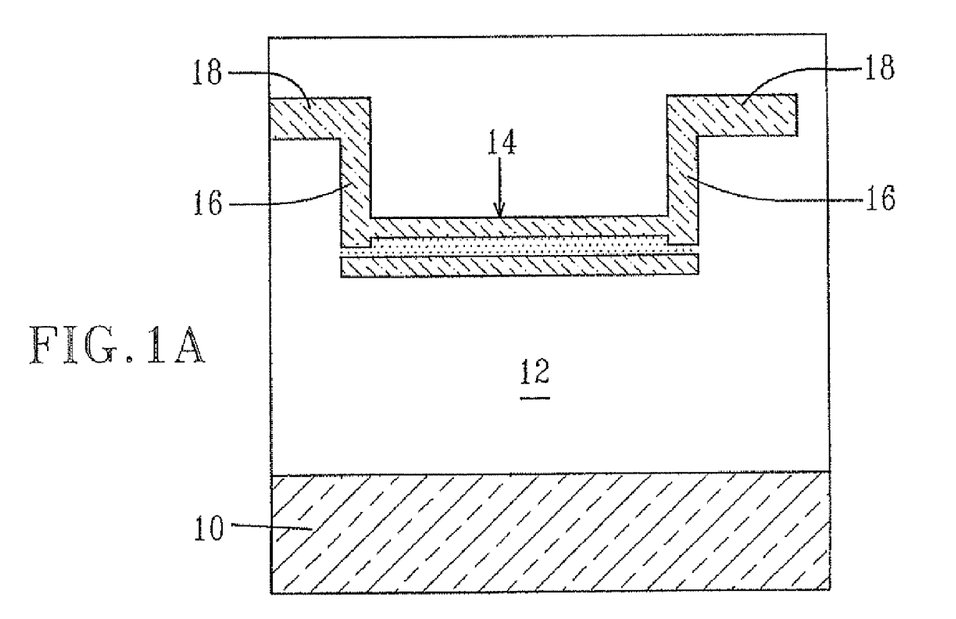
Figure 1B:
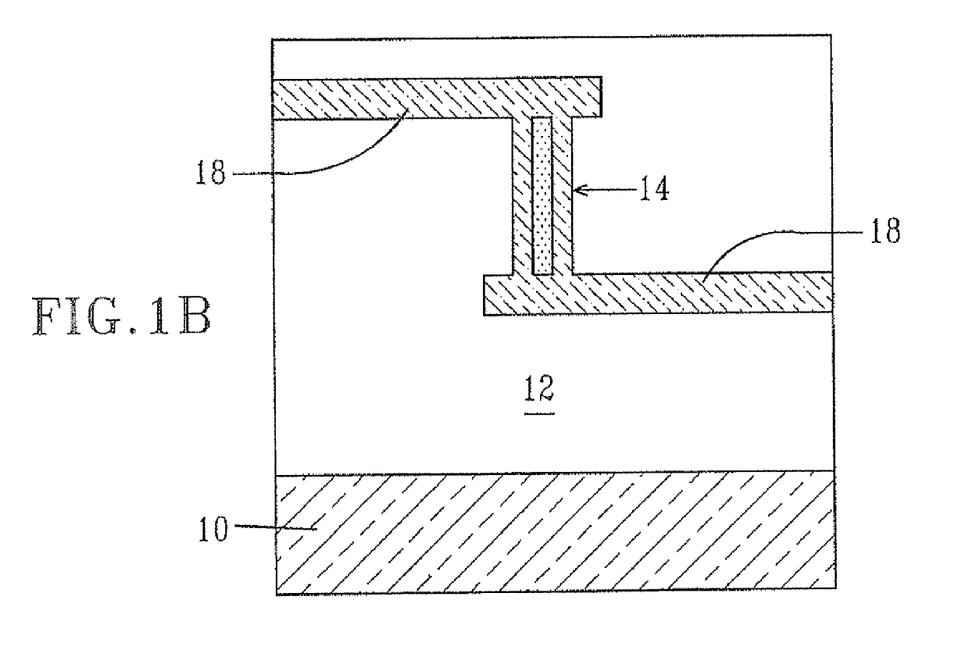

The SiN/TaN/SiN resistor can be fabricated into simple two-terminal arrays vertically (vertical to a semiconductor surface as a via type) or parallel (parallel to semiconductor surface) as shown in FIGS. 1A and 1B, respectively. In these drawings, reference numeral 10 refers to the substrate, reference numeral 12 to the low thermal conductivity ILD material, reference numeral 14 denotes the phase-change TaN resistor, reference numeral 16 refers to a via contact such as a W via contact, and reference numeral 18 refers to a metal line such as an Al line.

Figure 2:
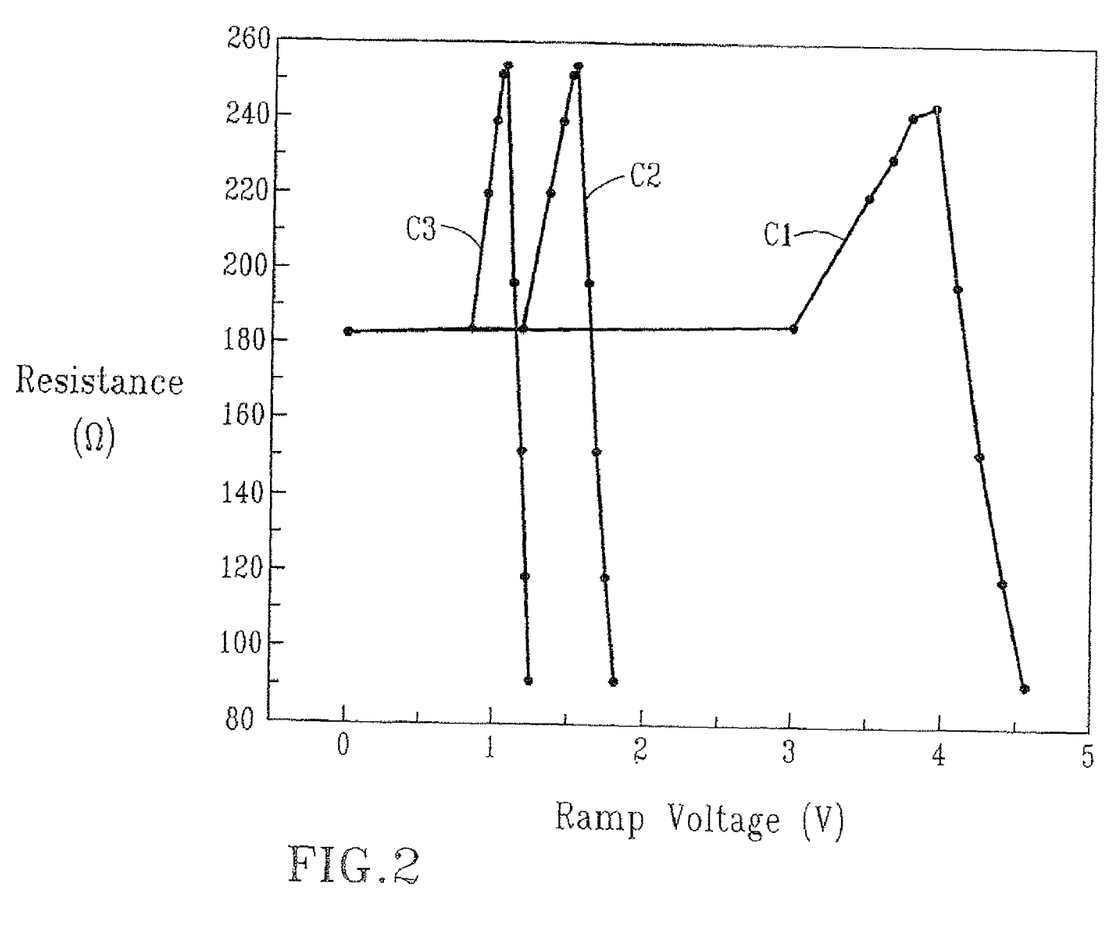
FIG. 2 is a graph showing resistance (ohms) vs. maximum ramp voltage (V) for the device element shown in FIGS. 1A and 1B.

As shown in FIG. 2, the impedance state clearly could be modulated by input electrical power due to Joule heating induced TaN phase change. In FIG. 2, Curve 1 is the resistance vs. ramp voltage for a 15 μm×45 μm TaN phase change resistance; Curve 2 is for a 1 μm×3 μm TaN phase change resistance; and Curve 3 is for a 0.5 μm×1.5 μm TaN phase change resistance.

Positive or negative voltage/current pulses can change the resistance of TaN in times shorter than 100 ns. In the drawing, the existence of at least 4 distinct levels as the resistance increase curve demonstrates that two bits of information can be stored in such a simple device. The physics of such resistance change is attributed to phase transition inside of TaN. A relevant property of such phase change is its ability to keep its information for very long times as far as sensing voltage/current less than writing voltage/current. By increasing input electrical power even more (over a threshold), a drastic resistance drop could also be observed. Such resistance drop again is attributed to 2nd amorphous-crystalline phase transition inside TaN.

Because of the above properties of the TaN based element, the applicants have determined that the TaN based element can be optimally coupled with a nonlinear silicon device, such as a diode of a FET, to form electrically alterable non-volatile memory array with short access time, low-cost, high density, and low power operation.

In the discussion that follows, one embodiment of the present invention is described which illustrates how to use the TaN based element to form a triple state read only memory. It is noted that the operation of such a memory cell is not restricted to three levels, and is not restricted to ROM only configurations. More levels and one-time electrical programming could be addressed in principle.

As stated above, the following is a description of a phase-change TaN resistor based triple state read only memory (ROM). The conventional ROM (read only memory) is a two logic state device which limits the information density of the memory. In the illustrated embodiment of the present invention, a triple state ROM based on a phase-change TaN resistor is provided that does not limit the information density of the memory and thus represents and improvement over conventional ROMs.

Figure 3:
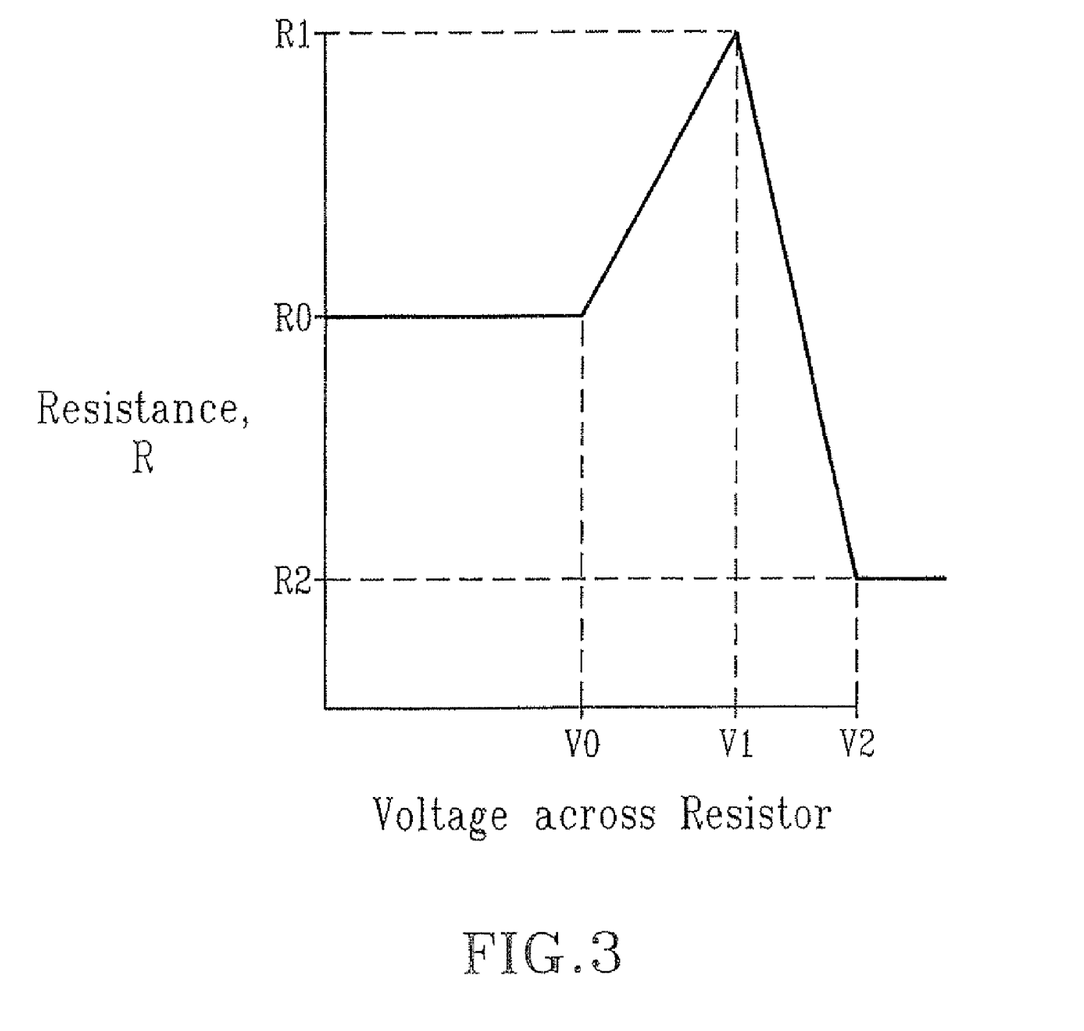
FIG. 3 is a resistance vs. voltage graph for the device element of the present invention.

Reference is first made to FIG. 3 which shows the resistance-voltage curve of the phase-change TaN resistor that is employed in the present invention. When the voltage applied on the phase-change TaN resistor is less than V0, the resistance is R0. When the voltage is greater than V0, the resistance increases linearly with the voltage to a peak value of R1 at the voltage of V1. When the voltage exceeds V1, the resistance decreases linearly with the voltage increasing down to minimum value of R2 at the voltage of V2. One of the more important properties of the phase-change TaN resistor used in the present invention is that the resistor has the memory of the voltage, and thus the resistance will keep the value at the highest voltage applied on it. This property provides the feasibility to form a triple state ROM: the resistance R0 presents the logic 0, the resistance value R1 presents the logic 1, and the resistance R2 presents the logic state of 2.

The IC memory chip including a memory cell of the phase-change TaN resistor as well as write and read circuits is shown FIG. 4. Specifically, in FIG. 4, one cell of the ROM inside of the block 50 comprises one phase-change TaN resistor 14 and two FETs, M1 and M2 as the address selection switch. It is noted that in FIG. 4, V1 and V2 refer to voltages 1 and 2, respectively, M1, M2, M3, etc. refer to FETs, Vref 1 and Vref 2 refer to reference voltage 1 and 2, respectively, gnd refers to ground, write_1 and write_2 refer to write operations 1 and 2, respectively, Vdd is the power supply, I1, I3 etc refer to controlled current sources and PR also refers to the phase-change TaN resistor. In FIG. 4, standard electronic symbols which are well known in the art have been used in describing the various elements of the IC shown. Also, the solid circles denote nodes where coupling occurs, the solid squares shown terminal regions. The terminal regions of the FETs can typically source/drain regions and the terminal regions of the capacitor are the capacitor plates.

The write circuit, which bases on the voltage sweep operation, comprises a capacitor C0, a voltage control current source unit, a high input impedance voltage comparator U3, discharge FET M9, threshold selection switching FETs M5 and M6, and switching FETs M7 and M8 and a two-input NAND circuit U5. Specifically, the write circuit includes threshold switching field effect transistors M5 and M6 in parallel arrangement coupled to a positive input terminal of the voltage comparator U3, the output of the comparator U3 is in connection with the control terminal c of a voltage control current source through the NAND circuit U5; eighth switching field effect transistor M8 coupled to a capacitor C0, said capacitor C0 is also coupled to said voltage control current source U4; and a discharge field effect transistor M9 having terminal ends that are coupled to terminal ends of said capacitor C0.

The voltage control current source is a three terminal unit, the two terminals, a and b, of which are for the current and the third terminal, c for control. When the third terminal c is at logic low, the current is turned ON, when c is at logic high, the current is turned OFF. The detail circuit is shown in FIG. 5.

In FIG. 5, the terminal a is connected to a positive power supply, the FETs M10 and M13 form a switching current mirror controlled by FETs M11 and M12. M10 is the primary side of the current mirror, M13 is secondary side of the current mirror. When the terminal, c is at logic low, M11 is turned ON, M12 is turned OFF, the gate of M10 and the gate of M13 are connected, M10 and M10 are in the status of the current mirror, the drain current of M10, I1 is mirrored to the drain current of M13, the current I1 sources to outside through the terminal, b. When the terminal, c is at logic high, M11 is turned OFF, M12 is turned ON, the connection between the gate of M13 and the gate of M10 is broken, and the gate of M13 is connected to the positive power supply through M12 so that M13 is turned OFF, no current sources to outside through terminal, b.

When logic 0 is to be written, "write_0_n" is at logic low, the output of U5, NAND or the control signal c of U4 is always at logic high, the current source U4 is turned OFF, and the resistor PR, i.e., 14, keeps the initial resistance value of R0.

When logic 1 is to be written "write_1" is at logic high, M5 is turned ON, V1 is applied to the positive input of the comparator U3 as the threshold voltage, in the meantime the write signal "write" is changed from logic low to logic high, "$\overline{\text{write}}$" is changed from logic high to logic low, M9 is turned OFF, U4, M7, M8 are turned ON and U4 starts to charge the capacitor C0 with the current I1, the voltage cross C0 increases, and the voltage on PR, 14, increases as well. Moreover, U3 has a very high input impedance, and the voltage cross M7 and M1 can be ignored. U3 monitors the voltage on PR (phase-change resistor 14), when the voltage on PR reaches V1, U3 output switches from logic high to logic low, U4 is turned OFF, the charging to C0 stops. Because the maximum voltage on PR is V1, the resistance of PR keeps R1.

The operation of writing logic 2 is similar to that of logic 1, but the threshold voltage of U3 is V2 instead of V1, therefore the maximum voltage on PR is V2, the resistance of PR after the operation keeps R2.

The read circuit includes a current source I3, two high input impedance voltage comparators U1, U2 and the switching FETs M3 and M4. Specifically, the read circuit includes the positive input of the first voltage comparator U1 and the positive input of the second voltage comparator U2 connected in parallel to one terminal end (e.g., drain) of the third switching field effect transistor M3; the other terminal end (e.g., source) of M3 is coupled to the voltage measurement terminal 1 of cell 50. One terminal end (e.g., drain) of the fourth switching field effect transistor M4 is coupled to the current source I3, other terminal end (e.g., source) of M4 is coupled to the current terminal 2 of cell 50. The gate of M3 and the gate of M4 are connected in parallel and coupled to the digital signal of read operation.

The current provided by I3 is the read current, Iread, which must meet the following formula:

$$Iread * R1 < V0$$

wherein R1 and V0 are as defined above. Since Iread meets the above formula, the read operation never changes the resistance of PR.

The two reference voltages Vref1 and Vref2 are set to the following values:

$$Vref1=(R1+R0)*Iread/2$$

$$Vref2=(R0+R2)*Iread/2$$

wherein R0, R1 and R1 are the various resistance values of the phase-change TaN resistor as shown in FIG. 3.

Since R1>R2, Vref1>Vref2. If the resistance of PR is R1, the voltage on PR is R1*Iread>Vref1, both of the outputs of U1 and U2 are at logic high. If the resistance of PR is R2, the voltage on PR is R2*Iread<Vref2, both of the outputs of U1 and U2 is at logic low. If the resistance of PR is R0, the voltage on PR is R0*Iread between Vref1 and Vref2, the output of U1 is at logic low and the output of U2 is logic high.

Therefore a simple decoder U3 can indicate the information stored in the cell.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A nonvolatile integrated circuit memory chip comprising a read circuit in connection with a SiN/TaN/SiN thin film resistor cell, said SiN/TaN/SiN thin film resistor cell includes a SiN/TaN/SiN thin film resistor embedded within a dielectric material having a thermal conductivity of about 1 W/m-K or less.

2. The nonvolatile integrated memory chip of claim 1 wherein said thin film resistor cell comprises first and second switching field effect transistors, wherein one terminal of the first switching field effect transistor and one terminal of the second switching field effect transistor are connected in parallel and both are coupled to one terminal end of said SiN/TaN/SiN thin film resistor, another terminal of the first switching field effect transistor is coupled to a first terminal of said resistor and another terminal of the second switching field effect transistor is coupled to a second terminal of said resistor.

3. The nonvolatile integrated memory chip of claim 2 wherein the read circuit comprises first and second voltage comparators in which the positive inputs are connected in parallel to one terminal end of a third switching field effect transistor;
a current source coupled to one terminal end of a fourth switching field effect transistor, wherein the other terminal end of said fourth switching field effect transistor is coupled to said second terminal end of the memory cell, wherein said third and fourth switching field effect transistors including gates that are connected to each other in parallel and coupled to a digital signal of the read operation, said first voltage comparator having its negative input coupled to a first reference voltage and said second voltage comparator having its negative input coupled a second reference voltage; and
a decoder having two inputs coupled to outputs of the first and second voltage comparators.

4. The nonvolatile integrated circuit memory chip of claim 1 wherein said dielectric material is an interconnect dielectric layer.

5. The nonvolatile integrated circuit memory chip of claim 1 wherein said dielectric material comprises at least one of hydrogen silsesquioxane, methyl silsesquioxane, sol-gel porous silica, a carbon doped oxide, tetramethylsilane, trimethylsilane, methylsilane, a mixture of tetramethylsilane and a silane, or a $SiO_2$.

6. The nonvolatile integrated circuit memory chip of claim 1 wherein said TaN undergoes a phase change as a function of an applied voltage.

7. The nonvolatile integrated circuit memory chip of claim 1 wherein said SiN/TaN/SiN thin film resistor cell includes a SiN/TaN/SiN thin film resistor that is vertical or parallel to a surface of a semiconductor substrate.

8. The nonvolatile integrated circuit memory chip of claim 1 wherein said SiN/TaN/SiN thin film resistor cell provides a triple state or multi-state read only memory.

9. A nonvolatile integrated circuit memory chip comprising a read circuit in connection with a SiN/TaN/SiN thin film resistor cell, wherein said SiN/TaN/SiN thin film resistor cell provides a triple state or multi-state read only memory.

10. The nonvolatile integrated memory chip of claim 9 wherein said thin film resistor cell comprises first and second switching field effect transistors, wherein one terminal of the first switching field effect transistor and one terminal of the second switching field effect transistor are connected in parallel connection and both are coupled to one terminal end of said SiN/TaN/SiN thin film resistor, another terminal of the first switching field effect transistor is coupled to a first terminal of said resistor and another terminal of the second switching field effect transistor is coupled to a second terminal of said resistor.

11. The nonvolatile integrated memory chip of claim 10 wherein the read circuit comprises first and second voltage comparators in which the positive inputs are connected in parallel to one terminal end of a third switching field effect transistor;
a current source coupled to one terminal end of a fourth switching field effect transistor, wherein the other terminal end of said fourth switching field effect transistor is coupled to said second terminal end of the memory cell, wherein said third and fourth switching field effect transistors including gates that are connected to each other in parallel and coupled to a digital signal of the read operation, said first voltage comparator having its negative input coupled to a first reference voltage and said second voltage comparator having its negative input coupled a second reference voltage; and
a decoder having two inputs coupled to outputs of the first and second voltage comparators.

12. The nonvolatile integrated circuit memory chip of claim 10 wherein said SiN/TaN/SiN thin film resistor cell includes a SiN/TaN/SiN thin film resistor embedded within a dielectric material having a thermal conductivity of about 1 W/m-K or less.

13. The nonvolatile integrated circuit memory chip of claim 12 wherein said dielectric material is an interconnect dielectric layer.

14. The nonvolatile integrated circuit memory chip of claim 10 wherein said TaN undergoes a phase change as a function of an applied voltage.

15. The nonvolatile integrated circuit memory chip of claim 10 wherein said SiN/TaN/SiN thin film resistor cell includes a SiN/TaN/SiN thin film resistor that is vertical or parallel to a surface of a semiconductor substrate.

16. A nonvolatile integrated circuit memory chip comprising a read circuit in connection with a SiN/TaN/SiN thin film resistor cell, wherein said thin film resistor cell comprises first and second switching field effect transistors, wherein one terminal of the first switching field effect transistor and one terminal of the second switching field effect transistor are connected in parallel connection and both are coupled to one terminal end of said SiN/TaN/SiN thin film resistor, another terminal of the first switching field effect transistor is coupled to a first terminal of said resistor and another terminal of the second switching field effect transistor is coupled to a second terminal of said resistor, and wherein the read circuit comprises first and second voltage comparators in which the positive inputs are connected in parallel to one terminal end of a third switching field effect transistor; a current source coupled to one terminal end of a fourth switching field effect transistor, wherein the other terminal end of said fourth switching field effect transistor is coupled to said second terminal end of the memory cell, wherein said third and fourth switching field effect transistors including gates that are connected to each other in parallel and coupled to a digital signal of the read operation, said first voltage comparator having its negative input coupled to a first reference voltage and said second voltage comparator having its negative input coupled a second reference voltage; and a decoder having two inputs coupled to outputs of the first and second voltage comparators.

17. The nonvolatile integrated circuit memory chip of claim 16 wherein said SiN/TaN/SiN thin film resistor cell includes a SiN/TaN/SiN thin film resistor embedded within a dielectric material having a thermal conductivity of about 1 W/m-K or less.

18. The nonvolatile integrated circuit memory chip of claim 16 wherein said TaN undergoes a phase change as a function of an applied voltage.

19. The nonvolatile integrated circuit memory chip of claim 16 wherein said SiN/TaN/SiN thin film resistor cell includes a SiN/TaN/SiN thin film resistor that is vertical or parallel to a surface of a semiconductor substrate.

20. The nonvolatile integrated circuit memory chip of claim 16 wherein said SiN/TaN/SiN thin film resistor cell provides a triple state or multi-state read only memory.

* * * * *